US006909163B2

(12) United States Patent
 Pfizenmaier et al.

(10) Patent No.: US 6,909,163 B2
(45) Date of Patent: Jun. 21, 2005

(54) HIGH-FREQUENCY OSCILLATOR FOR AN INTEGRATED SEMICONDUCTOR CIRCUIT AND THE USE THEREOF

(75) Inventors: Heinz Pfizenmaier, Murhardt (DE); Juergen Hasch, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 23 days.

(21) Appl. No.: 10/250,743

(22) PCT Filed: Aug. 9, 2002

(86) PCT No.: PCT/DE02/02940

§ 371 (c)(1),
(2), (4) Date: Jul. 7, 2003

(87) PCT Pub. No.: WO03/041173

PCT Pub. Date: May 15, 2003

(65) Prior Publication Data

US 2004/0046234 A1 Mar. 11, 2004

(30) Foreign Application Priority Data

Nov. 9, 2001 (DE) .......................................... 101 56 255

(51) Int. Cl.⁷ ....................... H01L 29/00; H01L 21/8238
(52) U.S. Cl. ....................... 257/499; 257/604; 438/218; 438/294; 438/353
(58) Field of Search ................................. 438/218, 294, 438/353, 400; 257/499, 604

(56) References Cited

U.S. PATENT DOCUMENTS 4,992,763 A    2/1991   Bert

2002/0171115 A1 * 11/2002  Nakatani ..................... 257/499

OTHER PUBLICATIONS

Langer, D.: "An Integrated MMW Radar System . . . ", Proceedings of the 1996 International Conference on Robotics and Automation. Minneapolis, Apr. 22–28, 1996, Proceedings of the International Conference on Robotics and Automation, New York, IEEE, US BD. 1 CONF. 13, Apr. 22, 1996, pp. 417–422.

Lyons C., et al: "A Low-Cost MMIC Based Radar . . . ", Intelligent Vehicles Symposium 2000. IV 2000. Proceedings of the IEEE Dearborn, MI USA Oct. 3–5, 2000, Piscataway, NJ, USA, IEEE, US Oct. 3, 2000, pp. 688–693.

Sattler S et al: "A Coplanar Millimeterwave Resonator on Silicon" Microwave and Millimeter-Wave Monolithic Circuits Symposium, 1993, Digest of Papers, IEEE 1993 Atlanta, GA USA 14–15, Jun. 14, 1993, pp. 57–60.

* cited by examiner

Primary Examiner—Hsien-Ming Lee
(74) Attorney, Agent, or Firm—Michael J. Striker

(57) ABSTRACT

A high frequency oscillator for an integrated semiconductor circuit is a component of the semiconductor circuit, which is comprised of a first silicon layer, an adjoining silicon dioxide layer (insulation layer), and an additional subsequent silicon layer (structured layer), (SOI wafer), wherein the high frequency oscillator is comprised of a resonator with a metallized cylinder made of silicon disposed in the structured layer and a coupling disk that overlaps the cylinder in the vicinity of the layer, and an IMPATT diode that is connected to the cylinder of the resonator via a recess in the coupling disk.

11 Claims, 6 Drawing Sheets

HIGH-FREQUENCY OSCILLATOR FOR AN INTEGRATED SEMICONDUCTOR CIRCUIT AND THE USE THEREOF

BACKGROUND OF THE INVENTION

The invention relates to a high frequency oscillator for an integrated semiconductor circuit and use thereof.

The use of semiconductor technology in automotive engineering is on the rise. Miniaturization is permitting not only improved control and regulation techniques for engine-specific functions, but is also opening the way for new safety and driving comfort systems such as parking assistance, pre-crash and side-crash functions, blind spot detection, fill level measurements, and distance measurement. Sensory mechanisms in the vehicle—miniaturized if possible—must be provided for all controlling and regulating actions.

As a rule, for the exemplary areas of used mentioned above, contactless sensors are used, which emit a measuring beam of a particular frequency that is reflected against the object to be measured, is received again by means of a receiver unit, and is then evaluated.

For fill level measurements, there are known measuring devices in the microwave range of approximately 2 to 24 GHz, which operate either according to the FMCW principle or as pulse radar. For robust stationary use under problematic ambient conditions—for example in receptacles containing combustible materials or at high ambient temperatures—fill level sensors of this kind are designed with supporting substrates such as Teflon or RT/duroid. Short-range radar systems for motor vehicles are also known, which are used for parking assistance or as pre-crash sensors, and have a measurement frequency in the vicinity of approximately 20 GHz.

For distance measurements up to ranges of 150 m, sensors have been developed through various approaches. Ultrasonic units are very inexpensive, but are relatively imprecise for this task due to their low degree of beam focusing. Laser distance measuring devices are significantly more precise, but cannot be miniaturized at will and are very expensive. There are also known distance sensors that can be used to execute measurements in the microwave range. The sensors required for this are in fact based on semiconductor circuits, but the necessary excitation sources (oscillators) can only be installed into the semiconductor circuit later with conventional hybrid techniques. It is disadvantageous here that the miniaturization is already limited due to the difficulty in reproducing the coupling of the transmitters to the semiconductor circuit. Moreover, the oscillators subsequently installed into the semiconductor circuit require expensive adjustment. The precision of the measurements also depends, among other things, on the stability of the transmission frequency. Reference oscillators required for frequency stabilization must then also be installed and adjusted.

A subsequent installation of the oscillators also requires the provision of costly connection architecture in the semiconductor circuit, including thermocouples such as copper heat sinks. Due to their insufficient frequency stability and pronounced phase jitter at frequencies above 40 GHz, known oscillators appear to be unsuitable for use in this frequency range.

SUMMARY OF THE INVENTION

The integration of the high frequency oscillator according to the invention overcomes the above-mentioned problems of the prior art. The high frequency oscillator is distinguished by the fact that it is a component of the semiconductor circuit, which is comprised of a first silicon layer, an adjoining silicon dioxide layer (insulation layer), and an additional subsequent silicon layer (structured layer), (SOI wafer). The high frequency oscillator here is comprised of (a) a resonator with a metallized cylinder made of silicon disposed in the structured layer and a coupling disk that overlaps the cylinder in the vicinity of the layer, and (b) an IMPATT diode that is connected to the cylinder of the resonator via a recess in the coupling disk.

This produces a high frequency oscillator whose quality is increased by a factor of 10 in comparison to known oscillators, which generates stable frequencies with a low degree of phase jitter in the millimeter wave range (80 to 500 GHz). The measurement in the microwave range permits a high degree of beam focusing (less than ±5° half-power width). The semi-insulating silicon material that is used permits the use of microstrip line techniques to integrate the required planar components into the silicon membrane that is etched out in the vicinity of the cylindrical resonators, or also permits the use of coplanar techniques to integrate the required planar components into the surrounding silicon base substrate. All passive components such as micromechanically structured resonators, Schottky diodes, varactor diodes, as well as all active components such as IMPATT diodes, are integrated into the semi-insulating SOI wafer.

The high frequency oscillator preferably generates a fixed frequency in the range from 80 to 500 GHz, in particular from 100 to 150 GHz. The cylinders of the resonator are coated with an aluminum layer that is preferably approximately 1 $\mu$m thick, which results in the embodiment of the resonator that is filled with silicon. If need be, an additional metal layer, in particular a nickel layer, can be deposited, which makes it possible for the chip to be soldered. The coupling disks that overlap the resonators are preferably dimensioned so that no interfering transmission energy in the microwave range can come out from their edges.

In a preferred embodiment, the high frequency oscillator is voltage-controlled and a varactor diode is implanted at the edge of the coupling disk in order to constitute the control. The IMPATT diode is preferably supplied with voltage by means of two low-pass filters. The generated transmission energy of the high frequency oscillator is fed into a surrounding microstrip line circuit by means of a coupling element.

The high frequency oscillator according to the invention is preferably used as a component of a sensor for distance measurement. The sensor is particularly intended for use in motor vehicles for blind spot detection, pre-crash and side-crash detection, distance measurement, or parking assistance.

BRIEF DESCRIPTION OF THE DRAWINGS

The invention will be explained in detail below in conjunction with exemplary embodiments with reference to the accompanying drawings.

DESCRIPTION OF THE PREFERRED EMBODIMENTS

Figure 1:
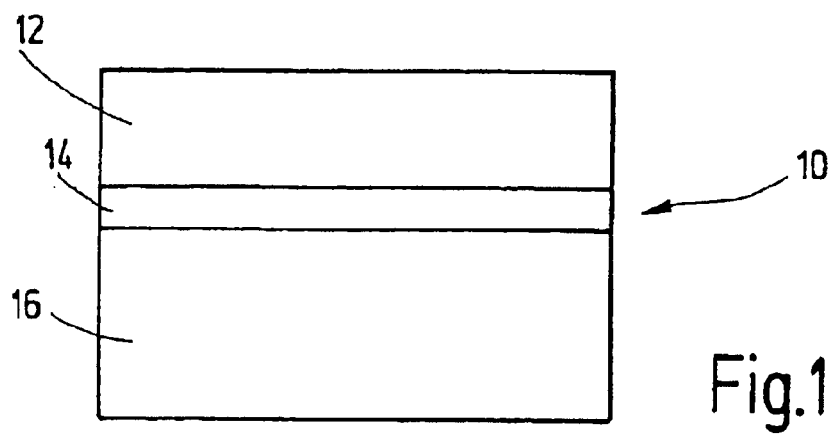
FIGS. 1 to 3 show schematic sectional views of a semiconductor circuit in the vicinity of a semiconductor component for high frequency measurements in different manufacturing stages.

FIG. 1 shows a schematic sectional view of a detail from a conventional SOI (silicon on insulator) wafer that is used to produce a semiconductor circuit 10, which supports the high frequency oscillator 30 according to the invention. Because it is widely known, the known manufacture of all components of the semiconductor circuit 10 in a single manufacturing step using coplanar or planar techniques will not be explained in detail here. The wafer is comprised of a 675 μm thick, semi-insulating $p^-$-doped structured layer 16 made of silicon. It has a specific resistance in the range from 500 to 1000 Ωcm, in particular 750 Ωcm. The structured layer 16 is coated with an approximately 300 nm thick insulation layer 14 of silicon dioxide, onto which is deposited a 50 μm thick, $p^-$-doped layer 12 of silicon.

Figure 2:
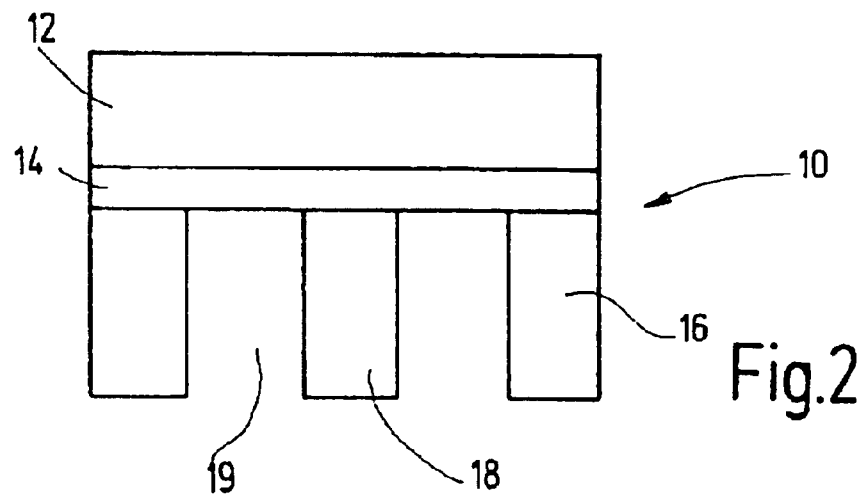

The insulation layer 14 of silicon dioxide serves as an etch stop in the trench etching of the micromechanical structures into the structured layer 16. The trench etching process uncovers a membrane, which is comprised of the precisely 50 μm thick layer 12 and the 300 nm thick insulation layer 14, so that a cylinder 18 of silicon remains (FIG. 2). The cylinder 18 is more or less encompassed by a free space 19.

Figure 3:
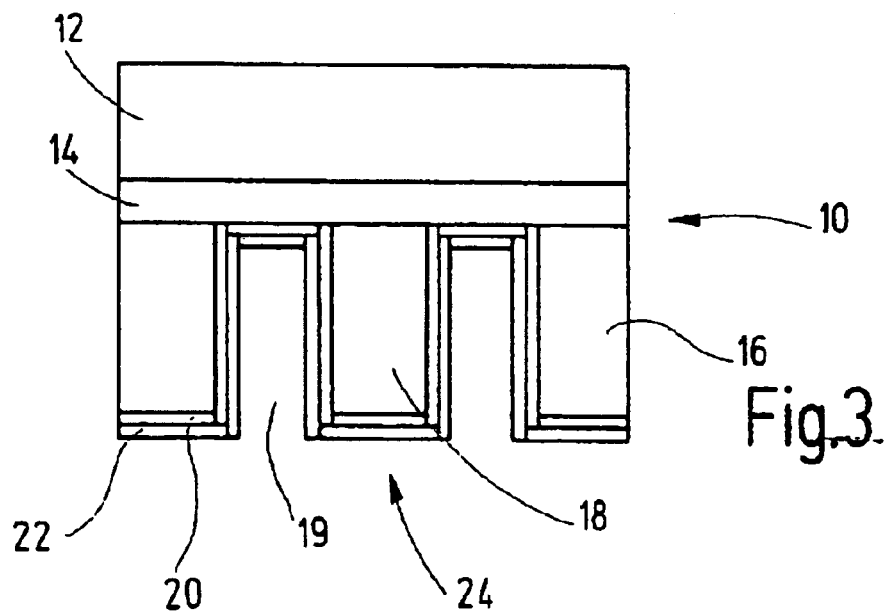

By means of vapor deposition or sputtering, the cylindrical structure 18 produced is coated with an approximately 1 μm thick aluminum layer 20 (FIG. 3). The thus metallized cylinder 18 is used as a high-quality ($Q^-200$) resonator 24 filled with semi-insulating silicon, which can be excited selectively in the $TE_{111}$ mode, depending on the conditions required. In addition, a nickel layer 22 can optionally be deposited onto the aluminum layer 20. The nickel layer serves as a soldering base that allows the chip (semiconductor circuit 10) with the high frequency oscillator to be soldered if need be into a housing or the like.

Figure 4:
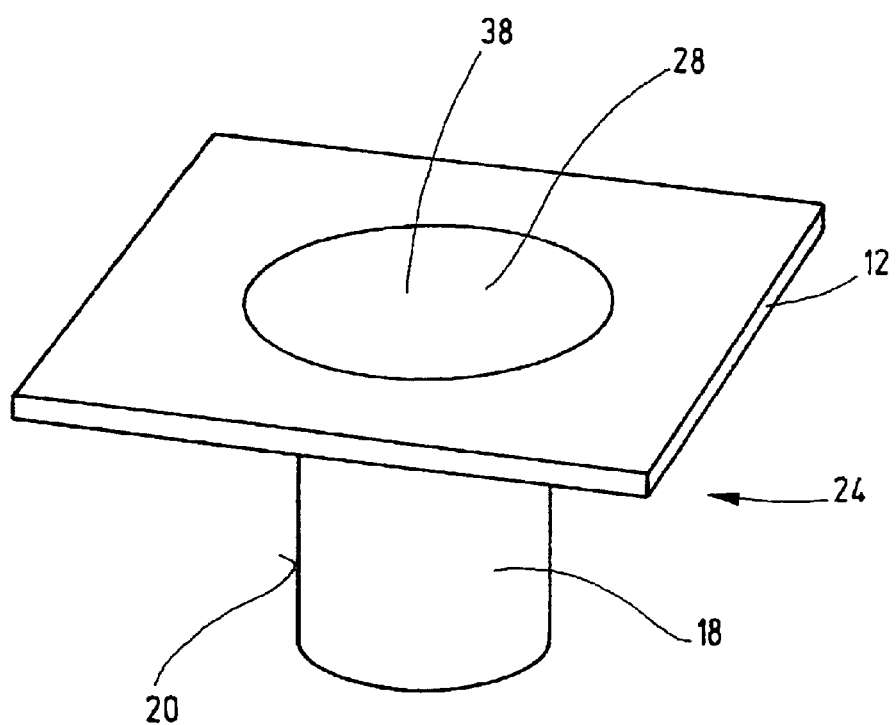
FIG. 4 shows a perspective side view of a resonator for a high frequency oscillator.

A region of the layer 12 above the cylinder 18 has a coupling disk 28 vapor deposited onto it, which extends beyond the cylinder 18 underneath it (FIG. 4). A recess 38, in particular embodied as a slot, is structured into the coupling disk 28. The coupling disk 28 is dimensioned so that no microwave energy can come out from its edge, i.e. the diameter of the coupling disk 28 is greater than the diameter of the cylinder 18. With a suitable voltage supply, the resonator 24 is suitable for use as a transmitter. The resonator 24 for a high frequency oscillator 30 that will be explained in more detail below has a height of approximately 725 μm and a radius of 242 μm that is matched to the desired resonator frequency 112.3 GHz.

Figure 5:
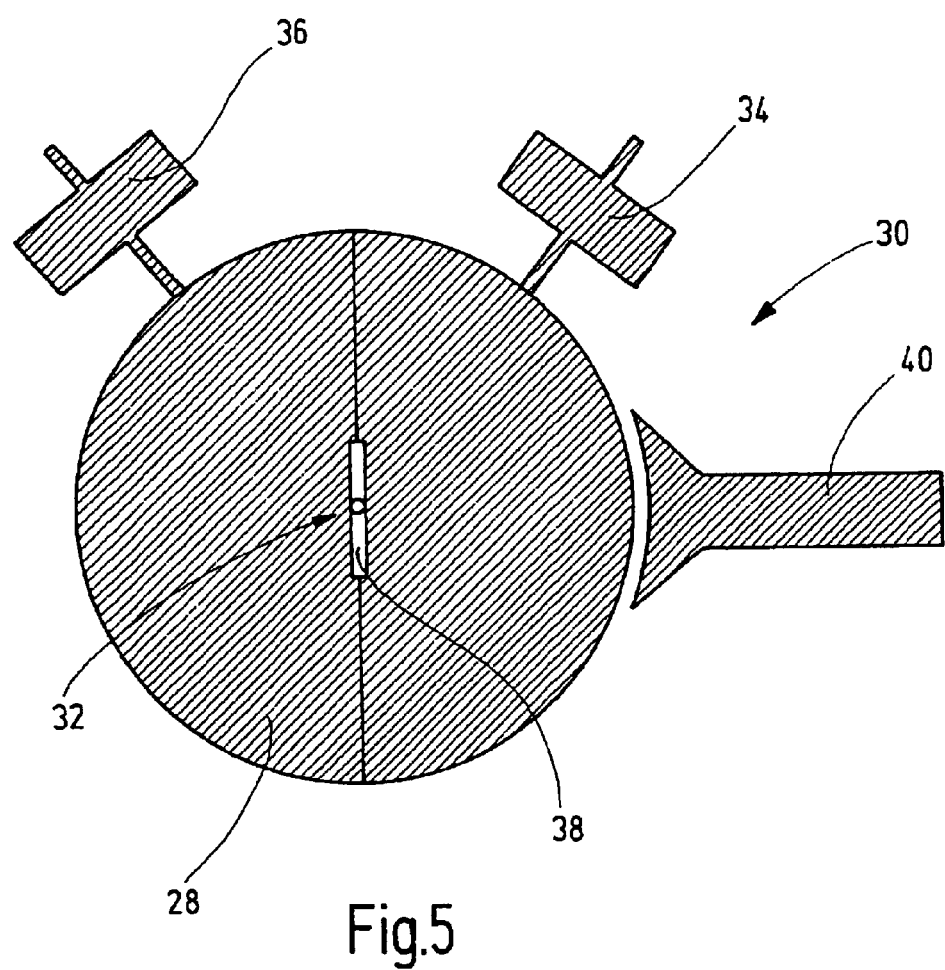
FIG. 5 shows a schematic top view of a high frequency oscillator.

FIG. 5 shows a top view of a high frequency oscillator 30 of the type required for generating a transmission signal in the microwave range. In addition to the resonator 24, the high frequency oscillator 30 includes an IMPATT diode 32, which is supplied with voltage by means of two low-pass filters 34, 36. The IMPATT diode 32 is disposed in the recess 38 of the coupling disk 28 and makes it possible to connect to a microstrip line circuit (not shown) that is integrated into the layer 12. The recess 38 can have various shapes, but is in any case designed so that it is small enough in size to exert no influence on the high frequency properties of the oscillator 30. A coupling element 40 whose shape is adapted to that of the coupling disk feeds the generated transmission energy of the high frequency oscillator 30 into the surrounding microstrip line circuit. In the case of a voltage-controlled oscillator, in addition to the IMPATT diode 32, a varactor diode, likewise not shown, is implanted at the edge of the coupling disk 28.

Figure 6:
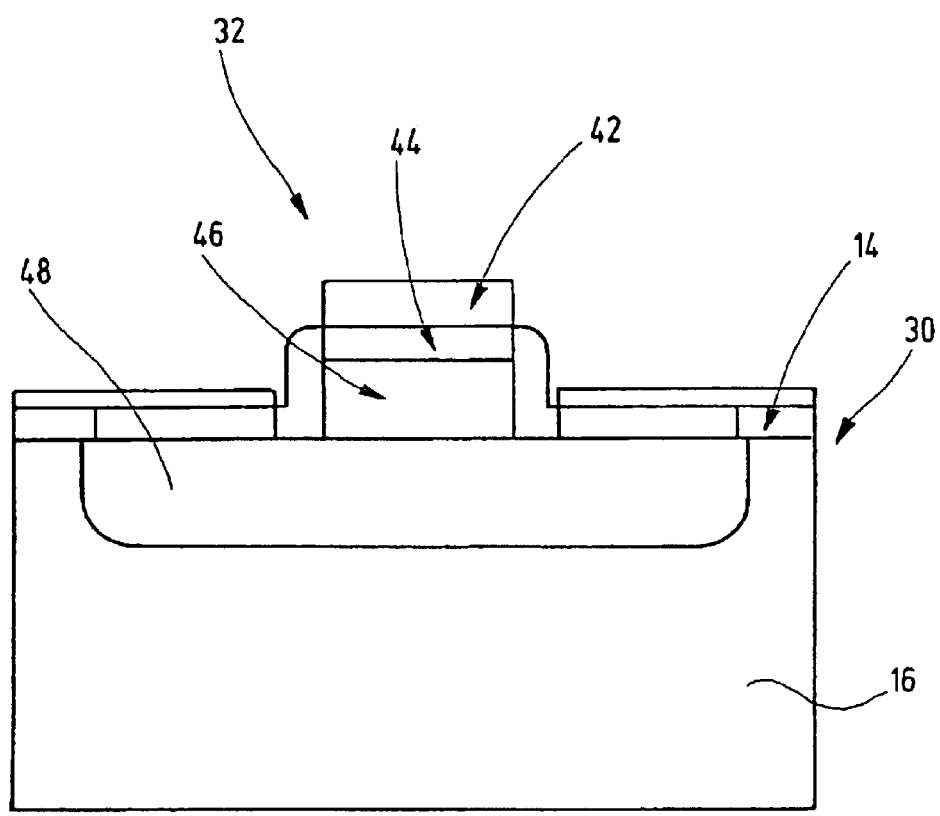
FIG. 6 shows a cross section through the semiconductor component in the vicinity of an IMPATT diode.

FIG. 6 shows a cross section through the semiconductor circuit 10 in the vicinity of the IMPATT diode 32. Since diodes of this kind are already known, it is not necessary to give a detailed description of their function here. In sequential order, the IMPATT diode 32 includes an aluminum layer 42, a $p^+$-doped silicon layer 44, an epi-silicon layer 46, and an $n^+$-doped layer 48.

Figure 7:
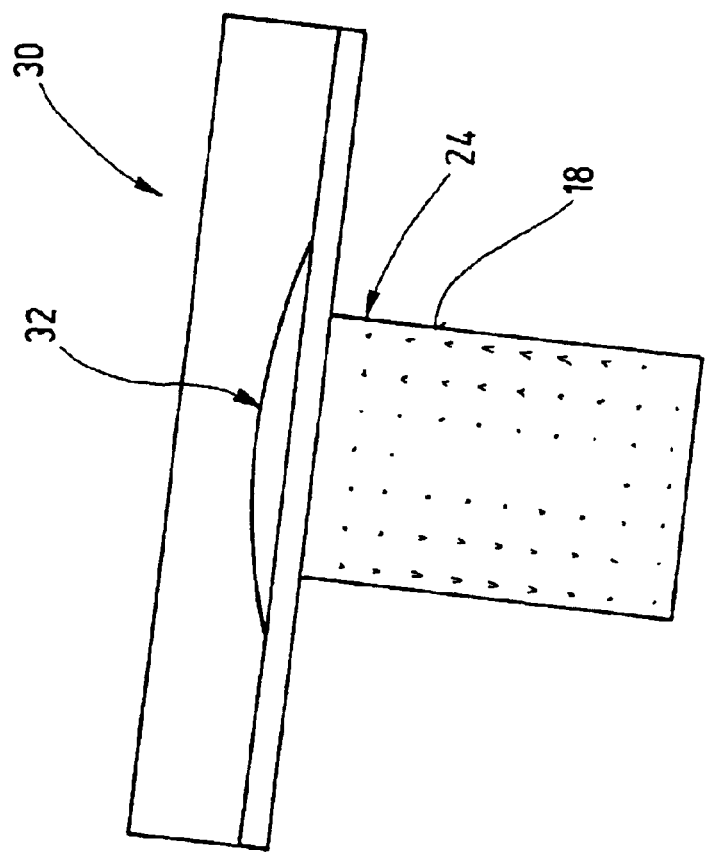
FIG. 7 shows a distribution of the electric and magnetic field lines in the $TE_{111}$ mode.
Figure 7:
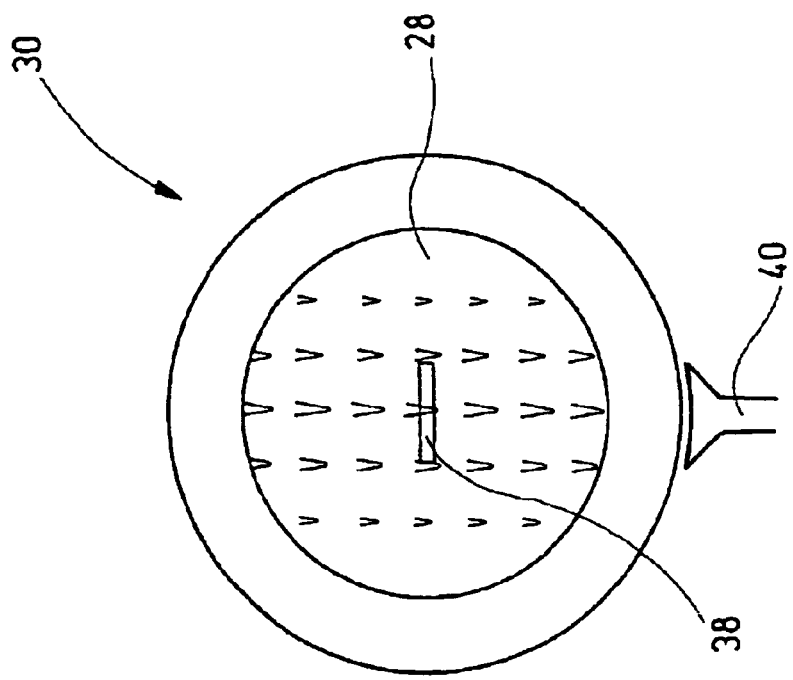

The high frequency oscillator 30 can be operated in the $TE_{111}$ mode, which is particularly favorable for high frequency excitations. FIG. 7 shows a distribution of the electric (top view on the left) and magnetic (sectional view on the right) field lines when the $TE_{111}$ mode is excited.

Figure 8:
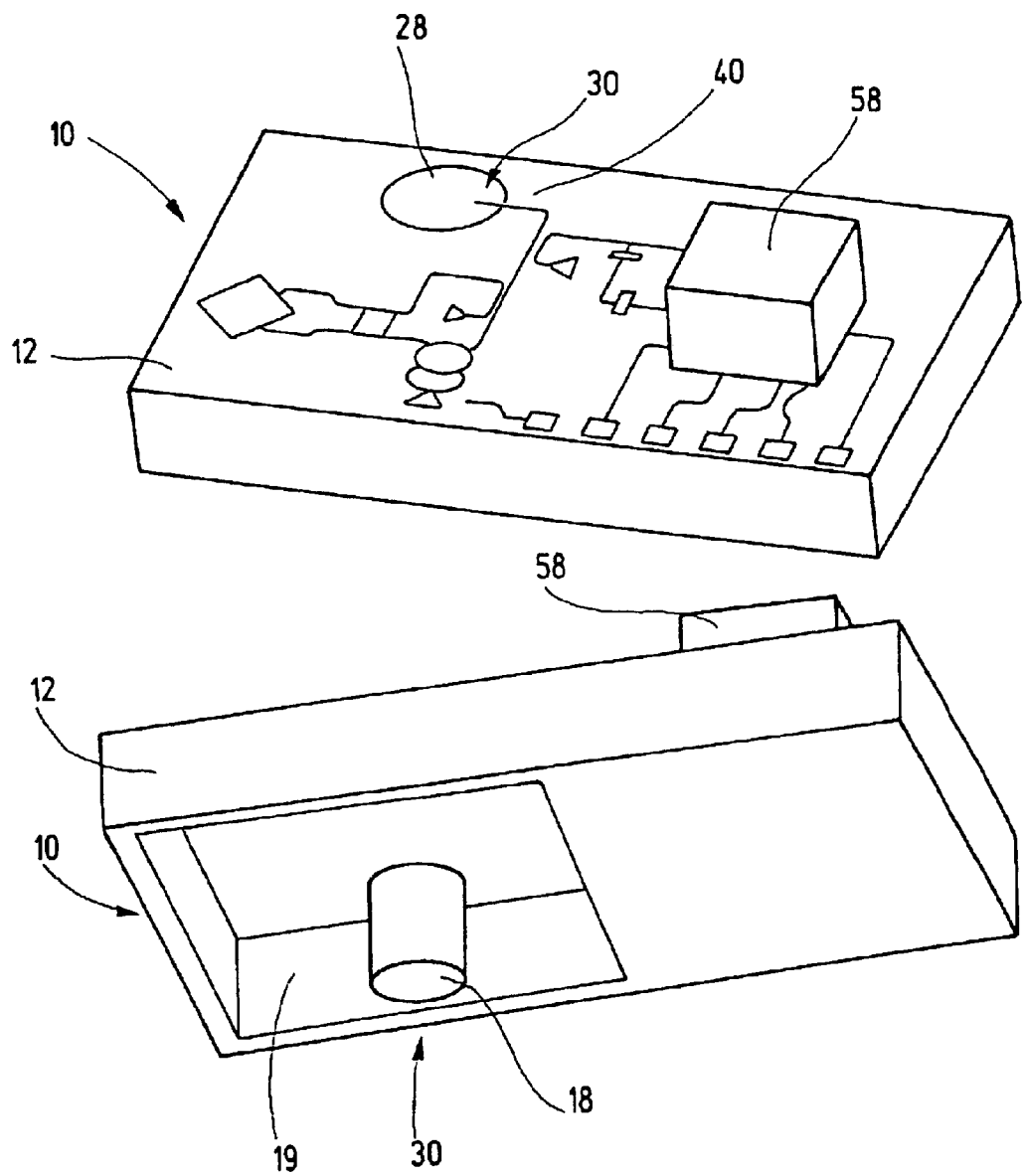
FIG. 8 shows two perspective views of a semiconductor circuit with an integrated high frequency oscillator.

FIG. 8 shows two perspective views of a semiconductor circuit 10 (chip) with an integrated high frequency oscillator 30, which is suitable for radar systems for distance measurement in the automotive environment. In order to improve frequency stabilization, an active oscillator circuit 58 is provided—in this instance, in the form of an additional GaAs semiconductor circuit, which is installed for example using the flip-chip technique. Alternatively, the active oscillator circuit 58 can be embodied in the form of a conductively glued, discrete individual transistor. The interface circuit required in this instance can likewise be integrated into the layer 12 of the semiconductor circuit 10 using coplanar and microstrip line techniques. The embodiment of the cylinder 18 protruding into the free space 19 is particularly visible in the bottom view.

What is claimed is:

1. A high frequency oscillator for an integrated semiconductor circuit, characterized in that the high frequency oscillator (30) is a component of the semiconductor circuit (10), which is comprised of a first silicon layer (12), an adjoining silicon dioxide layer (insulation layer (14)), and an additional subsequent silicon layer (structured layer (16)), (SOI wafer), wherein the high frequency oscillator (30) is comprised of
   (a) a resonator (24) with a metallized cylinder (18) made of silicon disposed in the structured layer (16) and a coupling disk (28) that overlaps the metallized cylinder (18) in the vicinity of the first silicon layer (12), and
   (b) an IMPATT diode (32) that is connected to the metallized cylinder (18) of the resonator (24) via a recess (38) in the coupling disk (28).

2. The high frequency oscillator according to claim 1, characterized in that the high frequency oscillator (30) is dimensioned so that it generates a fixed frequency in the range from 80 to 500 GHz.

3. The high frequency oscillator according to claim 1, characterized in that the metallized cylinder (18) of the resonator (24) is covered by an aluminum layer (20).

4. The high frequency oscillator according to one of claim 1, characterized in that the coupling disk (28) of the resonator (24) is dimensioned so that no transmission energy can come out from its edge.

5. The high frequency oscillator according to one of claim 1, characterized in that the high frequency oscillator (30) is voltage-controlled and a varactor diode is implanted at the edge of the coupling disk (28).

6. The high frequency oscillator according to one of claim 1, characterized in that the IMPATT diode (32) is supplied with voltage by means of two low-pass filters (34, 36).

7. The high frequency oscillator according to one of claim 1, characterized in that the first silicon layer (12) serves as a supporting substrate for a microstrip line circuit that is placed on it.

8. The high frequency oscillator according to one of claim 1, characterized in that the generated transmission energy of the high frequency oscillator (30) is fed into the surrounding microstrip line circuit by means of a coupling element (40).

9. The high frequency oscillator according to claim 2, characterized in that the high frequency oscillator (30) is dimensioned so that it generates a fixed frequency in the range from 100 to 150 GHz.

10. A sensor for distance measurements, comprising a high frequency oscillator for an integrated semiconductor circuit, wherein the high frequency oscillator (30) is a component of the semiconductor circuit (10), which is comprised of a first silicon layer (12), en adjoining silicon dioxide layer (insulation layer (14)), and an additional subsequent silicon layer (structured layer (16)), (SOI wafer), wherein the high frequency oscillator (30) is comprised of (a) a resonator (24) with a metallized cylinder (18) made of silicon disposed in the structured layer (16) and a coupling disk (28) that overlaps the metallized cylinder (18) in the vicinity of the first silicon layer (12), and (b) an IMPATT diode (32) that is connected to the metallized cylinder (18) of the resonator (24) via a recess (38) in the coupling disk (28).

11. The sensor as defined in claim 10, wherein the sensor is formed as a sensor usable in a motor vehicle for a function selected from the group consisting of blind spot detection, pre-crush detection, side-crush detection, parking assistance, and distance measurement.

* * * * *